(12) United States Patent
Creek

(10) Patent No.: US 6,933,746 B1
(45) Date of Patent: Aug. 23, 2005

(54) METHOD AND APPARATUS FOR COUPLING AN INPUT NODE TO AN OUTPUT NODE

(75) Inventor: William Robert Creek, Fremont, CA (US)

(73) Assignee: Planet Ate, Inc., Poway, CA (US)

( * ) Notice: Subject to any disclaimer, the term of this patent is extended or adjusted under 35 U.S.C. 154(b) by 0 days.

(21) Appl. No.: 10/442,367

(22) Filed: May 21, 2003

(51) Int. Cl.[7] .................. H03K 17/16; H03K 19/003
(52) U.S. Cl. .............................. 326/30; 327/378
(58) Field of Search ...................... 326/30, 31, 32, 326/33, 34; 327/378, 379

(56) References Cited

U.S. PATENT DOCUMENTS

| | | | |
|---|---|---|---|
| 4,707,620 A | | 11/1987 | Sullivan et al. |
| 5,107,230 A | * | 4/1992 | King ........................... 326/86 |
| 5,220,208 A | * | 6/1993 | Schenck ..................... 326/27 |
| 5,621,335 A | * | 4/1997 | Andresen .................... 326/30 |
| 5,955,890 A | | 9/1999 | Gillette |
| 6,445,245 B1 | | 9/2002 | Schultz et al. |
| 6,489,837 B2 | | 12/2002 | Schultz et al. |

OTHER PUBLICATIONS

Dallas Semiconductor MAXIM, Maxin Integrated Products, DS1858, entitled Dual Temperature-Controlled Resistors with Three Monitors, Rev O: Jan. 2003, pp. 1-22.

* cited by examiner

Primary Examiner—Daniel Chang

(57) ABSTRACT

One aspect of the present disclosure is a control device responsive to control signals for electrically coupling an input node configured for connection to a low impedance source to an output node configured for connection to a transmission line. The control device includes a first controlled impedance device having a pair of controlled nodes connected between the input node and the output node. The first controlled impedance device has a control node for controlling impedance values between the controlled nodes. Also included is a closed loop control circuit connected to the control node of the first controlled impedance device for varying impedance between the controlled nodes continuously over a range of impedance values based on parameters sensed by a parameter sense device. The closed loop control circuit maintains a constant relationship between an output impedance of the control device and transmission line impedance.

20 Claims, 3 Drawing Sheets

METHOD AND APPARATUS FOR COUPLING AN INPUT NODE TO AN OUTPUT NODE

BACKGROUND OF THE INVENTION

The present invention relates a control device responsive to control signals for electrically coupling an input node to an output node. More specifically, the present invention relates to a control device that makes use of a controlled impedance for varying impedance values continuously over a range of impedance values based on sensed parameters to maintain a selected output impedance value.

Integrated circuit devices frequently make use of an output driver circuit for providing output data to an output terminal. A conventional output driver circuit is described in U.S. Pat. No. 6,489,837, which includes an input terminal, an output terminal, P-channel transistors, n-channel transistors, and an input/output (I/O) pad. When a logic low signal is applied to the input terminal, the p-channel transistors are all turned on, thereby coupling the I/O pad to the positive supply voltage terminal. In this condition, the driver circuit presents a resistance to the I/O pad. This resistance is determined by the on resistances of the p-channel transistors taken in parallel.

Similarly, when a logic high signal is applied to the input terminal, n-channel transistors are all turned on, thereby coupling the I/O pad to the ground terminal. In this condition, the driver circuit presents a resistance to the I/O pad. This resistance is determined by the on resistance of the transistors taken in parallel.

It is sometimes desirable that the resistances presented to the I/O pad have a predetermined relationship with an external resistance, which is coupled to the I/O pad. For example, it may be desirable for the resistance presented to the I/O pad to match an impedance of a trace or wire coupled to the I/O pad to improve signal integrity.

Another example where it is desirable to have the resistance presented to the I/O pad have a predetermined relationship with an external resistance which is in the testing of the semiconductor integrated circuit devices. A driver within a tester is often used to apply a voltage signal at a selected high or low level to an input pin of a device under test (DUT) in order to place the DUT in a desired state. It is sometimes desirable to use a transmission line, such as a coaxial cable or micro strip structure, for signal propagation between an output pin of the tester and an input pin of the DUT. In this case, it is desirable to backmatch the output resistance of the driver with the characteristic impedance of the transmission line in order to avoid reflections in the signal path between the driver and the input pin of the DUT.

There are numerous problems associated with accurately providing a predetermined relationship between the output resistance of the driver and the external resistance coupled to the output pin or I/O pad. One problem is that the output resistance of the driver has an initial tolerance resulting from process parameter variation. This initial tolerance alters the relationship between the output resistance of the driver and the external resistance coupled to the output pin or I/O pad.

Another problem is that the output resistance of the driver tends to vary with environmental conditions such as temperature, drive voltage and aging effects, to name a few. Change in the output resistance results in a change in the relationship between the output resistance and the external resistance. Deviations from this predetermined relationship results in voltage variation at the external resistance connected to the I/O pad.

Yet another problem associated with providing a driver having an output resistance that has a predetermined relationship with the external resistance is that the external resistance coupled to the I/O pad may have an initial tolerance. For example, in the case where the external resistance coupled to the I/O pad is a transmission line, it may be difficult to maintain constant 50-ohm characteristic impedance in practical transmission line structures. Variations of plus or minus 3 ohms are quite common. A 3-ohm variation, which is a 6 percent variation in a transmission line impedance, results in a corresponding 6 percent initial amplitude error in the pulse delivered to the input pin of the DUT. Furthermore, reflections in the signal path between the driver and the input pin of the DUT can further vary the initial amplitude delivered to the input pin of the DUT. Therefore, deviations in resistance of either the output resistance or external resistance result in voltage variation at the I/O pad. In applications where timing critical these variations should be minimized.

Various solutions have been proposed to address one or more of the above problems such as that disclosed in U.S. Pat. No. 6,489,837. In this solution, a digital control circuit is used to select pull-up or pull down transistors to make discrete changes to the output resistance to better approximate the desired output resistance. These previously used solutions have shortcomings, however. It would be therefore desirable to have a circuit suitable for use as an output driver circuit which addresses the above discussed problems to create a highly accurate relationship between the resistances presented to the I/O to the external resistance coupled to the I/O pad.

SUMMARY OF THE INVENTION

One aspect of the exemplary embodiment is a control device responsive to control signals for electrically coupling an input node configured for connection to a low impedance source to an output node configured for connection to a transmission line. The control device includes a first controlled impedance device having a pair of controlled nodes connected between the input node and the output node. The first controlled impedance device has a control node for controlling impedance values between the controlled nodes. Also included is a closed loop control circuit connected to the control node of the first controlled impedance device for varying impedance between the controlled nodes continuously over a range of impedance values based on parameters sensed by a parameter sense device. The closed loop control circuit maintains a constant relationship between an output impedance of the control device and transmission line impedance.

Another aspect of the exemplary embodiment is a method for providing impedance compensation for a first switching device in a first current path. The first switching device has a first nominal output impedance and a first output impedance variation associated therewith. The method includes sensing impedance variation in a second switching device similar to the first switching device. The second switching device has a second nominal output impedance and a second output impedance variation. The second output impedance variation has a predetermined relationship to the first output impedance variation. Also included is determining proper impedance compensation for compensating for the second output impedance variation for the second switching device. Finally, providing the determined compensation to the first current path, the determined compensation compensating for the first output impedance variation.

DETAILED DESCRIPTION OF THE EXEMPLARY EMBODIMENT

Figure 1:
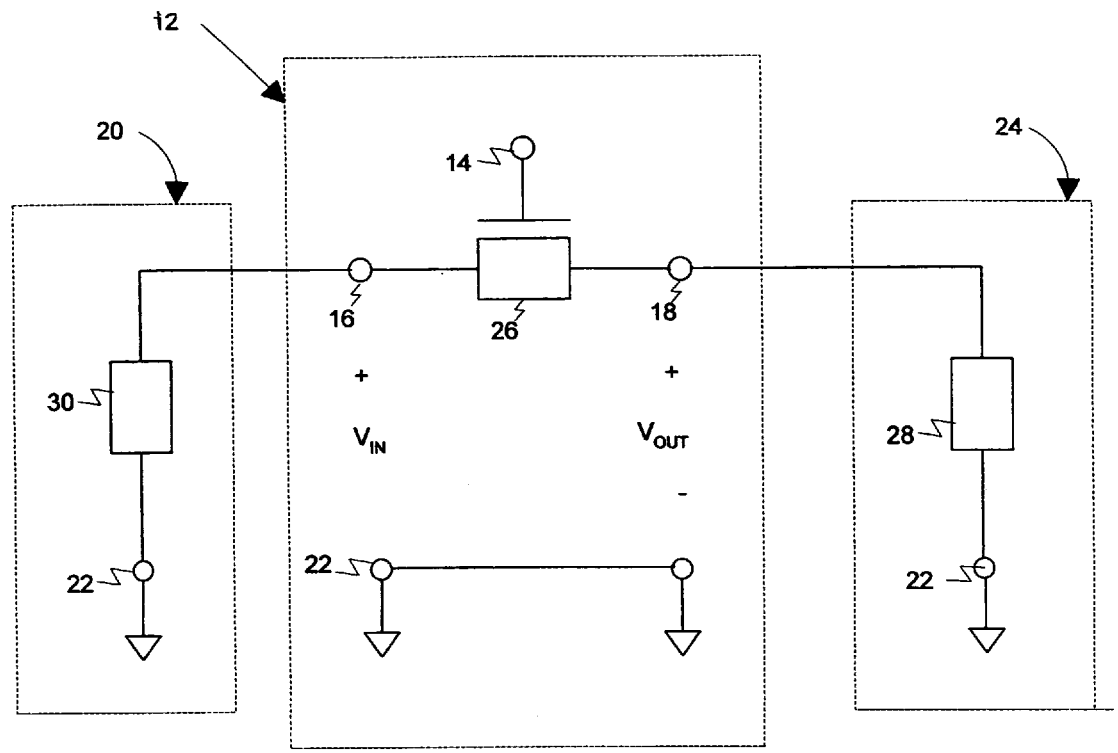
FIG. 1 is a block diagram of an exemplary embodiment of the control device in accordance of the present invention shown with an input node connected to a low impedance source and an output node connected to a load.

FIG. 1 illustrates a control device 12 in accordance with an exemplary embodiment of the present invention. The control device 12 is responsive to control signals provided to control node 14 for selectively coupling an input node 16 to an output node 18. A source device 20 is shown connected to the input node 16 for providing a selected input voltage between the input node 16 and a common reference node 22. A load device 24 is shown connected to the output node 18. With the control node 14 activated the input node 16 is coupled to the output node 18 thereby resulting in an output voltage between the output node 18 and the common reference node 22.

The control device 12 includes a controlled impedance switch 26 that is responsive to control signals at control node 14 for connecting the low impedance source device 20 connected to the input node 16 to the load device 24 connected to the output node 18. The controlled impedance switch 26 provides an output impedance that has a predetermined relationship with an input impedance 28 of the load device 24. In the case where it is desired that the output impedance of the control device 12 match the input impedance of the load device 24, the output impedance 26 of the control device 12 will be equal to the input impedance 28 of the load device 24. In some applications it is desirable that there be a slight mismatch between the output impedance 26 of the control device 12 and the input impedance 28 of the load device 24. Matching the output impedance 26 with the input impedance 28 as discussed herein will include conditions where slight mismatch is desired. The output impedance 26 of the control device 12 can be selected to have other relationships to the input impedance 28 of the load device 24, if desired.

The source device 20 is a low impedance voltage source 30 for providing a selected voltage at the input node 16 of the control device 12. In an exemplary embodiment, the low impedance source 30 is one of two low impedance sources. One of these sources is a supply voltage or a high voltage level and the other source is a common reference voltage or a low voltage level.

Figure 2:
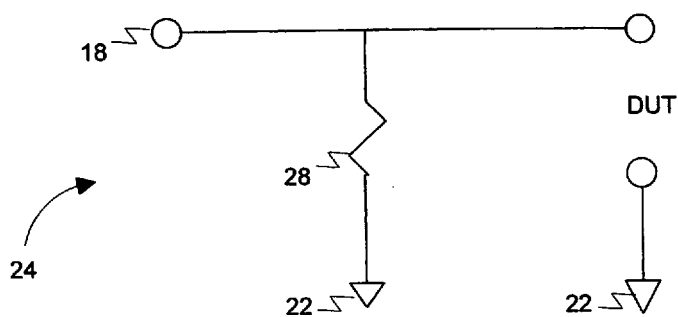
FIG. 2 is a schematic representation of a transmission line connected to a Device Under Test (DUT) representing an exemplary load device shown in FIG. 1.

FIG. 2 is a schematic representation of an exemplary embodiment of the load device 24 shown in FIG. 1. The load device 24 includes a transmission line represented by resistor 28 connected to a node that is configured for connection to an input node of a DUT. The transmission line has nominal impedance represented by resistor 28 connected between an input node and the common reference node 22. The DUT, not shown in FIG. 2, represents a wide variety of devices that can be connected between the transmission line 28 and common reference node 22 for testing. When testing a voltage that is applied to the DUT typically requires very precise timing. To ensure precise timing, the output impedance 26 and the impedance of the transmission line 28 are often matched to minimize reflections. Furthermore, this relationship between the output impedance 26 and the impedance of the transmission line 28 should not change over time due to environmental conditions or aging.

The load device 24 is alternatively a wide variety of electrical devices other than the transmission line 28. For example, the load device 24 is an electrical device such as a circuit board trace conductor or wire impedance coupled to an input pin of an integrated circuit. The load device 24 can be any load that requires accurate voltages or accurate signal timing.

Figure 3:
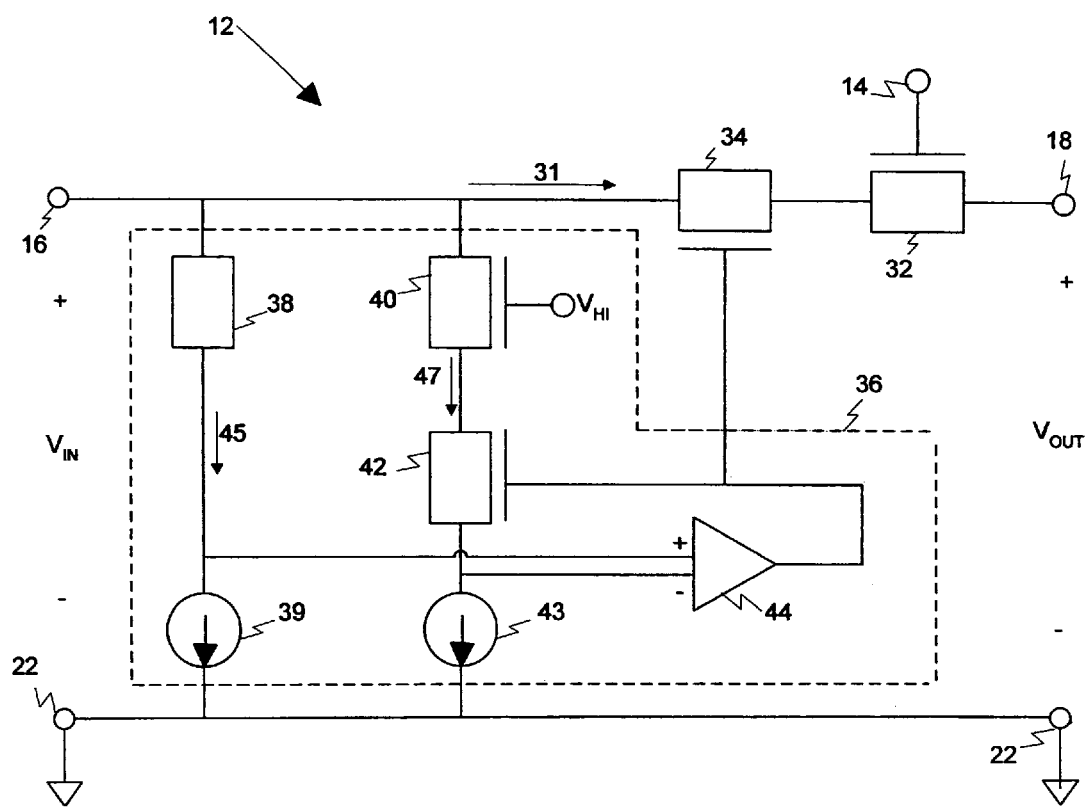
FIG. 3 is a more detail block diagram of an exemplary embodiment of the control device shown in FIG. 1.

FIG. 3 is a block diagram of one exemplary embodiment of the control device 12 shown in FIG. 1 for electrically coupling the input node 16 through a signal path 31 to the output node 18 in response to control signals provided to the control node 14. With the control signal activating the control node 14, the input node 16 is connected to the output node such that the output impedance of the control device 12 is maintained at a pre-selected value.

The control device 12 includes a switching device 32, a controlled impedance device 34 and a closed loop control circuit 36. The controlled impedance device 34 and the closed loop control circuit 36 maintain the output impedance of the control device 12 at a pre-selected value.

The switching device 32 includes a pair of controlled nodes and a control node 14. The pair of controlled nodes is connected between the input node 16 and the output node 18. When activated, the switching device 32 conducts current producing predetermined nominal impedance between the pair of controlled nodes. When inactivated, the switching device 32 does not conduct current providing nearly infinite impedance between the pair of controlled nodes.

The controlled impedance device 34 has a pair of controlled nodes connected between the input node 16 and the output node 18. The controlled impedance device 34 also includes a control node for varying impedance between the controlled nodes over a range of impedance values. In one exemplary embodiment the signal provided to the control node of the controlled impedance device 34 is an output signal provided by the close loop control circuit 36.

In the exemplary embodiment, the switching device 32 and the controlled impedance device 34 are connected in series between the input and output nodes, 16 and 18, respectively. The output impedance of the control device 12 for this embodiment is the sum of the impedance between the controlled nodes of the switching device 32 and the impedance between the controlled nodes of the controlled impedance device 34. Therefore, by controlling the impedance of the controlled impedance device 34, the output impedance of the control device 12 is controlled.

The closed loop control circuit 36 includes a reference impedance 38, a current source 39, a switching device 40, a controlled impedance device 42 and a current source 43. The reference impedance 38 is connected in a reference path 45 between the input node and the common reference node 22. The current source 39 is connected in series with the reference impedance 38 between the reference impedance 38 and the common reference node 22. In one exemplary embodiment, the current source 39 sinks a current creating a reference current in the reference path 45 that produces a voltage drop across the reference impedance 38.

In parallel with the reference path 45 is a sense path 47 that includes the switching device 40, the controlled impedance device 42 and current source 43. The switching device 40 includes a pair of controlled nodes and a control node.

The switching device 40 is similar to the switching device 32. Also included in the reference path 47 is a controlled impedance device 42 similar to the controlled impedance device 34.

The switching device 40 includes a pair of controlled nodes and a control node. The switching device 40 and the controlled impedance device 42 each have their controlled nodes connected between the input node 16 and the common reference node 22. In the exemplary embodiment, the switching device 40 and the controlled impedance device 42 each have their controlled nodes connected in series between the input node 16 and the common reference node 22. The control node of the switching device 40 is connected to a voltage source labeled $V_{HI}$ that provides a voltage potential that is sufficient to activate the switching device 40. In the exemplary embodiment, the voltage source $V_{HI}$ has a potential value that is equal to a potential value that is applied to the control node 14 for activating switching device 32.

The current source 43 is connected in series with each of the switching device 40 and the controlled impedance device 42. In one exemplary embodiment, the current source 43 sinks current to the common reference node 22 thereby establishing a sense current in each of the switching device 40 and the controlled impedance device 42. The sense current produces a voltage drop across each of the switching device 40 and the controlled impedance device 42.

The differential amplifier 44 includes a pair of differential input nodes for sensing a differential voltage and providing an output signal at an output node indicative thereof. The differential amplifier 44 includes a first differential input node that is connected to the reference path 45 for sensing the voltage drop across the reference impedance 38 and a second differential input node for sensing the voltage drop across the each of the switching device 40 and the controlled impedance device 42.

In the exemplary embodiment, the first differential input node is connected between each of the current source 39 and the reference impedance 38. The second differential input node is connected between each of the current source 43 and the series connection of the switching device 40 and the controlled impedance device 42.

The differential amplifier 44 senses differences in voltage drop between the reference impedance 38 and the combined voltage drop across each of the switching device 40 and the control impedance device 42. The output node of the differential amplifier 44 is connected to each of the controlled impedance device 42 and the controlled impedance device 34.

The differential amplifier senses voltage changes between the reference path 45 and the sense path 47 and provides a control signal to control the controlled impedance device 42 in the sense path 47. If the impedance in the sense path 47 is less than the impedance in the reference path 45 then the differential amplifier 44 will increase the impedance of the controlled impedance device 42. Conversely, if the impedance in the sense path is greater that the impedance in the reference path 45 then the differential amplifier 44 will reduce the impedance of the controlled impedance device 42. The output signal of the differential amplifier 44 is provided to that control terminal of the controlled impedance device 42 so that the combined impedance of the switching device 40 and the control impedance 42 will be maintained equal to the impedance of the reference impedance device 38.

The reference path 45 is designed to provide constant impedance. Changes in impedance by the switching device 40 are compensated for by the closed loop control circuit 36 that maintains constant impedance in the sense path 47 and signal path 31. The time constant of the closed loop control circuit 36 is selected to be small relative to the time constant associated with any of the factors producing impedance changes for the switching device 40. For example, thermal time constants that alter the impedance of the switching devices 32 and 40 are typically on the order of hundreds of microseconds. The time constant of the closed loop control circuit 36 is therefore selected to be small relative hundreds of microseconds to ensure proper operation. Ensuring that the time constant of the closed loop control circuit 36 is sufficiently small allows the closed loop control device 36 to vary impedance in the sense path 47 continuously over a range of impedance values.

The switching device 40 is similar to the switching device 32. Impedance changes in the switching device 40 are similar to impedance changes in switching device 32. The compensation required for the switching device 40 is similar to the compensation required for the switching device 32. Therefore, the switching device 32 impedance variations are compensated by providing to the compensation device 34 the same compensation signal provided to the compensation device 42 for compensating for switching device 40.

In one exemplary embodiment, the impedance value of the reference impedance 38 is selected to correspond to the desired output impedance of the switching device 12. The closed loop control system 36 compensates each of the signal path impedance and the sense path impedance to match the reference impedance 38.

By selecting a different value for the reference impedance 38 the output impedance of the control device 12 can be modified for loads 24 having different input impedance. Alternatively, the output impedance of the control device 12 is modified to compensate for initial tolerance of the load 24. For example, if an initial tolerance for a transmission line that is nominally 50 ohms results in a transmission line with an impedance of 53 ohms then the reference impedance 38 value is selected to be 53 ohms. The closed loop control system 36 will ensure the output impedance will be maintained at 53 ohms during operation.

Alternatively, the current value sourced or sunk by the current source 39 is modified to provide a different current instead of changing the impedance value of reference impedance 38 to set the output impedance for the control device 12. Adjusting the current source 39 value changes the voltage drop across the reference impedance 38 resulting in impedance compensation in each of the sense path 47 and signal path 31. The current source 39 can make use of an external resistor for setting the current source 39 values. In this manner, this external resistance can be selected to provide the selected output impedance value for the control device to maintain over various environmental conditions, aging etc. In one exemplary embodiment, this external resistance is a plurality of external resistors each having a different resistance value. One of the plurality of resistors is selected for providing a desired output impedance value.

Switching devices 32 and 40 are selected to have similar temperature coefficients and temperature gradients so that the impedance variations in the sense path 47 track impedance variations in the signal path 31. In one exemplary embodiment, switching devices 32 and 40 are configured to be physically close together on the same die so that each of these devices has similar temperature coefficients and temperature gradients. Similarly, the controlled impedance devices 34 and 42 are selected to have similar temperature coefficients and temperature gradients and in the exemplary embodiment are physically close together on the die.

In the exemplary embodiment, the switching device 40 is a scaled down version of the switching device 32. The current source is correspondingly scaled down to compensate. For example, where the switching device 40 is scaled down by a factor of 10 the impedance of the switching device 40 is increased by a factor of 10. To compensate, the current source 43 is scaled down by a factor of 10. By using proper scaling and scaling compensation the voltage drop across the switching device 40 will correspond to the voltage drop across the switching device 32. Therefore compensation in the sense path 47 will also provide proper compensation is achieved in the signal path 31. Changes such as initial tolerance, process parameters, and environmental factors such as temperature and aging are all compensated for by using this feedback control.

The current sources 39 and 43 have been described above as current sinks. Alternatively, the current source 39 is configured to source a current in the reference path 45 and is disposed between the input node 16 and the reference impedance 38. Similarly, the current source 43 is connected to source current in the sense path 47. For this configuration the current source is connected between the input node 16 and the series connected switching device 40 and the controlled impedance device 42. For this configuration input polarities associated with the differential amplifier 44 are reversed so that an inverting input of the differential amplifier 44 is connected to the reference path 45 and a non-inverting input of the differential amplifier 44 is connected to the sense path 47.

Figure 4:
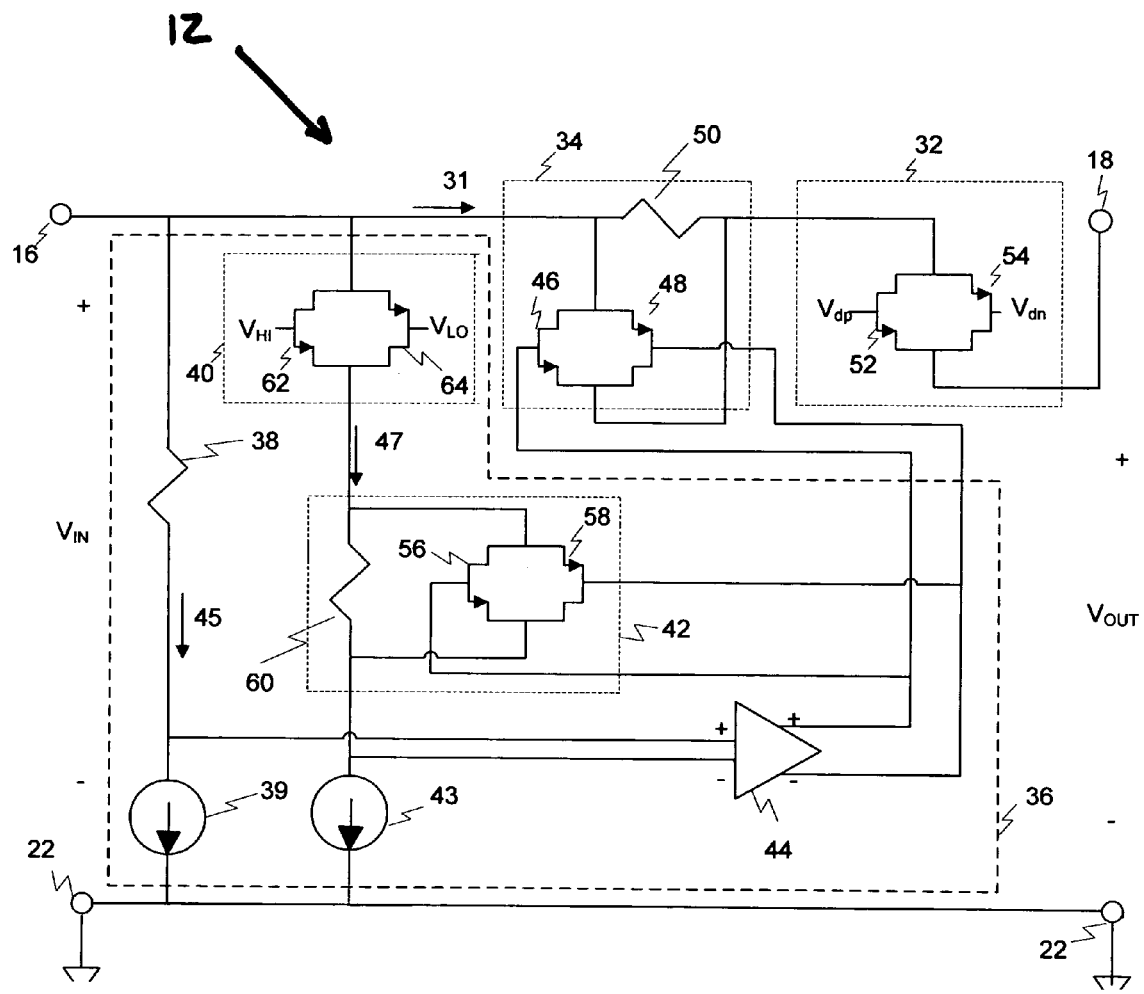
FIG. 4 is a schematic representation of the exemplary embodiment of the control device shown in FIG. 3.

FIG. 4 is a schematic diagram of one exemplary embodiment of the control circuit 12 shown in FIG. 3. Similar numbering is used in FIG. 4 to identify portions having functions similar to those portions in FIG. 3. In this exemplary embodiment, the control device 12 includes a switching device 32, a controlled impedance device 34 and a closed loop control circuit 36. The controlled impedance device 34 and the closed loop control circuit 36 maintain the output impedance of the control device 12 at a pre-selected value.

The signal path 31 includes a controlled impedance device 34. The controlled impedance device 34 includes an n-channel field effect transistor (FET) 46 and a p-channel FET 48 connected in parallel with each other as transmission gates between the input node 16 and the output node 18. The drain of the n-channel device 46 is connected to the source of the p-channel device 48 and the source of the n-channel device 46 is connected to the drain of the p-channel device 48. Each of the source of the n-channel device 46 and the drain of the p-channel device 48 and each of the drain of the n-channel device 46 and the source of the p-channel device are each connected between the input node 16 and output node 18, respectively, of the control device 12.

A gate node of each of the n-channel device 46 and the p-channel device 48 are increased and decreased, respectively, to reduce impedance between the input and output node 16 and 18. Conversely, the gate voltage of the n-channel transistor 46 and the gate voltage of the p-channel transistor 48 are reduced and increased, respectively, to increase the impedance between the input and output nodes 16 and 18, respectively, of the control device 12. Varying the gate voltages of the n-channel and p-channel transistors 46, 48, respectively, over a range of gate voltages continuously varies the impedance between the input and output nodes 16, 18, respectively. As this gate voltage is varied the impedance of the controlled impedance device 34 is varied continuously over a range of impedance values.

In an exemplary embodiment, an optional resistor 50 is connected in parallel with the transmission gate comprising transistors 46 and 48. For this configuration, each of resistor 50, FET 46 and FET 48 are all connected in parallel. This configuration reduces the parallel resistance thereby allowing the series resistance of the FET transistors 46 and 48 to be increased, reducing the physical size of FET transistors 46 and 48.

The switching device 32 includes an n-channel FET 52 and a p-channel FET 54 that are configured as transmission gates connected in parallel between input and output nodes 16 and 18, respectively, of the control device 12. A drain of the n-channel FET is connected to a source of the p-channel FET and a source of the n-channel FET is connected to a drain of the p-channel FET. A control signal labeled $V_{dp}$ and $V_{dn}$ is provided to the gates of FET transistors 52 and 54, respectively, for selectively operating the FET transistors 52 and 54 as switches. The control signal drives the gates of transistors 52 and 54 high and low, respectively, to activate the transmission gate such that characteristic impedance is provided between input and output nodes 16 and 18 of the control device 12. Conversely, the gates nodes of FET transistors 52 and 54 are driven low and high, respectively, or off to provide virtually an infinite impedance between the input and output nodes 16 and 18.

A closed loop control circuit 36 similar to the closed loop control circuit 36 described in FIG. 3 provides a differential output signal to the gates of transistors 46 and 48 for controlling the impedance of the controlled impedance device 34. The differential output signal is generated based on parameters sensed in a reference path 45 and parameters sensed in a sense path 47.

The reference path 45 of the closed loop control circuit 36 includes a resistor 38 connected in series with a current source 39 between the input node 16 and a common reference node 22. The current source 39 sinks current through resistor 38 to generate a voltage drop across resistor 38. The voltage drop across resistor 38 is equal to the input current at input node 16 minus the current provided by the current source 39 multiplied by the resistance of the resistor 38. This voltage drop across resistor 38 is the reference voltage that is provided to the differential input of differential amplifier 44.

The other input to the differential amplifier 44 is a voltage sensed in the sense path 47. The sense path 47 includes the switching device 40, the controlled impedance switch 42 and current source 43. The controlled impedance device 42 is similar to the controlled impedance device 34 previously discussed. The controlled impedance device 42 includes an n-channel FET 56 and a p-channel FET 58 connected in parallel as a transmission gate between the input node 16 and the common reference node 22. The drain of the n-channel device 56 is connected to the source of the p-channel device 58 and the source of the n-channel device 56 is connected to the drain of the p-channel device 58. Each of the source of the n-channel device 56 and the drain of the p-channel device 58 and each of the drain of the n-channel device 56 and the source of the p-channel device 58 are each connected between the input node 16 and the common reference node 22, respectively.

In one exemplary embodiment, FETs 56 and 58 used in the sense path 47 are scaled versions of FETs 46 and 48, respectively, used in the signal path 31. By scaling FETs 56 and 58 to be smaller than FETs 46 and 48, respectively, die area as well as power dissipated in these FETs are less than the die area and power dissipated in FETs 46 and 48 used in the signal path 31. FETs 56 and 58 are connected in parallel as a pair of transmission gates within the sense path 47. Each of the gates of transistors 56 and 58 are connected to opposite nodes of the differential output of differential amplifier 44.

In one exemplary embodiment, an optional resistor 60 is connected in parallel with the transmission the pair of transmission gates or FETs 56 and 58. For this configuration, each of resistor 60, FET 56, and FET 58 are connected in parallel. This configuration reduces the parallel resistance thereby allowing the series resistance of the FET transistors 56 and 58 to be increased, reducing the physical size of FET transistors 56 and 58.

Switching device 40 is connected in series with the controlled impedance device 42 and in parallel to the reference path 45. The switching device 40 is similar to the switching device 32 shown in the signal path 31. The switching device 40 includes an n-channel FET 62 and a p-channel FET 64 that are configured as transmission gates connected between the input node 16 and common reference node 22, respectively, of the control device 12. A drain of the n-channel FET 62 is connected to a source of the p-channel FET 64 and a source of the n-channel FET 62 is connected to a drain of the p-channel FET 64. A control signal is provided to the gates of FET transistors 62 and 64 for selectively operating the FET transistors 62 and 64 as switches. The control signal drives the gates of transistors 62 and 64 high and low, respectively, to activate the transmission gate such that characteristic impedance is provided between input node 16 and common reference node 22 of the control device 12.

In the exemplary embodiment, FETs transistors 62 and 64 associated with switching device 40 in the sense path 47 are sized to be proportionally smaller than the FETs 52 and 54, respectively, associated with switching device 32 in the signal path 31. By making FETs 62 and 64 proportionally smaller than FETs 52 and 54 of the signal path allows the die area required to define these FETs to be smaller and require less power to operate. The gates of FETs 62 and 64 are connected to a high voltage source $V_{HI}$ and a low voltage source $V_{LO}$, respectively, such that each of these FETs 62 and 64 are active thereby producing a characteristic impedance thereacross.

A current source 43 is connected in the reference path 47 to sink current through each of the switching device 40 and controlled impedance device 42. A voltage drop across the switching device 40 is equal to the input current at the input node 16 minus the current source 43 sinks times the characteristic impedance of the switching device 40. This voltage drop is provided to the inverting input of the differential amplifier 44. The differential amplifier 44 senses changes in impedance between the resistor 38 and the characteristic impedance of the switching device 40 and compensates for these changes with the control impedance device 42. In this manner, this compensation will tend to reduce the voltage differences until the inputs to the differential amplifier 44 are identical. Once the inputs to the differential amplifier 44 are identical then changes in the characteristic impedance of the switching device 40 are properly compensated.

The differential output signal from differential amplifier 44 is also provided to the controlled resistance device 34 for providing corresponding compensation in the signal path. The switching device 32 is related to the switching device 40 in the sense path. Therefore, compensation for the switching device 40 in the signal path can also be properly scaled to compensate for the changes in impedance of the switching device 32 in the signal path. In this manner, changes in impedance of the switching device 32 due to environmental conditions such as temperature and aging effects can be compensated for. In addition, changes due to process variation are also compensated for. By more closely controlling the relationship between output impedance of the control device 12 and the input impedance of the load device 24 shown in FIG. 1, voltages across the load device 24 can be more carefully controlled.

In another exemplary embodiment, the control device 12 shown in FIG. 4 is formed on the same die or as a single integrated circuit except current source 43 is external to the integrated circuit. Current source 43 in this case is generated by maintaining a fixed electrical potential across a precision resistor. Accurate current sources on an integrated circuit are difficult to generate because resistances can vary as much as 25 percent with process variation. Therefore greater precision can be achieved using external resistors.

In an exemplary embodiment, the current source 39 is defined using a resistor that has similar geometry as resistor 38. Therefore variations in resistance of resistor 38 and the resistor used to generate current source 39 both track each other. Increases in resistance values of resistor 38 should result in a corresponding decrease in current sunk by current source 39 thereby producing a stable voltage drop across resistor 38.

The control device 12 is activated to determine a control signal voltage level or bias level for the controlled impedance device 26 to provide proper compensation in the signal path 31 so that the output impedance of the control device 12 is set to a predetermined impedance. The control signal voltage level or bias level can be set or maintained at this voltage level and the feedback control circuit 36 can be inactivated. This allows a power saving in the control device 12 because currents are no longer required in the reference path 45 and sense path 47.

Alternatively, the control device 12 continuously senses parameters within the reference path 45 and sense path 47 and continuously adjusts the control inputs of the controlled impedance device 34 to maintain constant output impedance during operation. Because output impedance is continuously adjusted there are no voltage spikes between the output terminal 18 and the common reference terminal 22 that could disrupt sensitive operations such as device testing.

What is claimed is:

1. A control device responsive to control signals for electrically coupling an input node configured for connection to a low impedance source to an output node configured for connection to a transmission line, the control device including:

a first controlled impedance device having a pair of controlled nodes connected between the input node and the output node, the first controlled impedance device having a control node for controlling impedance values between the controlled nodes;

a second controlled impedance device, similar to the first controlled impedance device, and having a pair of controlled nodes and a control node, the second controlled impedance device having an impedance variation characteristic that is related to an impedance characteristic associated with the first controlled impedance device;

a closed loop control circuit connected to the control node of the second controlled impedance device for providing a compensation signal to the control node of the second controlled impedance device based on impedance variation of the second controlled impedance device relative to a reference; and wherein the closed loop control circuit is connected to the control node of the first controlled impedance device to provide compensation for the first controlled impedance based on the compensation for the second controlled impedance device.

2. The control device of claim 1 wherein impedance variation of the second controlled impedance device is based on variation between the second controlled impedance device and a reference, and wherein the closed loop control circuit varies the impedance value of the first controlled impedance device to compensate for impedance variation between the reference and the second controlled impedance device.

3. The control device of claim 1 wherein the first controlled impedance device is responsive to control signals provided to the control node for selectively varying an impedance value between the pair of controlled nodes over a continuous range of impedance values to compensate for impedance variation in the first controlled impedance device.

4. The control device of claim 1 wherein the reference is selected to have an impedance substantially equal to an impedance associated with the transmission line and wherein the closed loop control circuit varies the impedance value of the first controlled impedance device to maintain an impedance of the first controlled impedance device substantially equal to the impedance of the reference.

5. The control device of claim 1 wherein the impedance characteristic of the first controlled impedance device varies based on one of process variation and environmental variation.

6. The control device of claim 1 wherein the closed loop control circuit has a time constant that is small relative to a time constant associated with impedance variation of the second controlled impedance device.

7. The control device of claim 1 wherein the reference is a reference impedance and wherein the closed loop control circuit device further includes
   a parameter sensing device for sensing parameter variation between each of the reference impedance and the controlled nodes of the second controlled impedance for inferring impedance variation in the first controlled impedance wherein the closed loop control circuit provides the sense output signal indicative of inferred impedance variation to the control node of the first controlled impedance device.

8. The control device of claim 7 wherein each of the first and second controlled impedance devices are transmission gates.

9. The control device of claim 1 wherein each of the first and second controlled impedance devices are transmission gates and wherein the second controlled impedance device is a scaled version of the first controlled impedance device.

10. The control device of claim 1 further including a a reference impedance connected between the input node and a common node and wherein the controlled nodes of each of the first and the second controlled impedance devices are connected in parallel with the reference impedance and wherein the closed loop control circuit further includes a differential amplifier having a pair of input nodes connected between the reference impedance and the second controlled impedance device and an output node connected to the control nodes of each of the first and second controlled impedance devices.

11. The control device of claim 1 wherein 1 each of the first and second controlled impedance devices include:

a switching device having a pair of terminals, the switching device responsive to control signals for selectively allowing current through the pair of terminals; and
an impedance control device having a pair of terminals connected in series with the pair of terminals of the switching device, the impedance control device responsive to control signals for varying the impedance over a range of impedance values.

12. An integrated driver circuit having an input node for connection to a voltage source and an output node configured for connection to a load, the integrated driver circuit having a nominal output impedance associated therewith, the nominal output impedance having and an output impedance variation associated therewith, the integrated driver circuit comprising:
   a first variable impedance device connected between the input node and the output node, the first variable impedance device having a first output impedance variation;
   a second variable impedance device similar to the first variable impedance device and having an output impedance variation having a predetermined relationship to the first output impedance variation;
   a control circuit connected to each of the first and second variable controlled impedance devices, the control circuit determining proper impedance compensation for compensating for the second output impedance variation for the second variable impedance device and scaling the determined impedance compensation based on the predetermined relationship and providing the scaled compensation to the first variable impedance device to compensate for the first output impedance variation.

13. The integrated driver circuit of claim 12 wherein the control circuit varies the output impedance to select the nominal output impedance.

14. The integrated driver circuit of claim 13 wherein the nominal output impedance is based on a reference impedance.

15. The integrated driver circuit of claim 12 wherein the control circuit is configured to receive an input for selecting an output impedance value from a plurality of output impedance values and wherein the control circuit varies the selected output impedance value to compensate for the selected output impedance variation.

16. The integrated driver circuit of claim 15 wherein the selected output impedance value is selected to provide a predetermined relationship between the nominal output impedance and a load impedance and wherein the impedance variation results from temperature variation.

17. A method for providing impedance compensation for a first switching device in a first current path, the first switching device having a first nominal output impedance and a first output impedance variation associated therewith, the method comprising:
   sensing impedance variation in a second switching device similar to the first switching device, the second switching device having a second nominal output impedance and a second output impedance variation, the second output impedance variation having a predetermined relationship to the first output impedance variation;
   determining proper impedance compensation for compensating for the second output impedance variation for the second switching device; and
   scaling the determined impedance compensation based on the predetermined relationship and providing the scaled compensation to the first current path, the determined compensation compensating for the first output impedance variation.

18. The method of claim 17 wherein the second switching device is in a second current path different from the first current path and wherein determining proper impedance compensation for compensating for the second output impedance variation is accomplished using a closed loop control circuit for varying a variable impedance device connected in the second current path.

19. The method of claim 17 wherein determining proper impedance compensation includes comparing an impedance of the second switching device to an impedance of a reference impedance.

20. A control device responsive to control signals for electrically coupling an input node configured for connection to a low impedance source to an output node configured for connection to a transmission line, the control device including:

a first controlled impedance device connected in a signal path between the input node and the output node;

a second controlled impedance device connected in a sense path between the input node and a common node, the first and second controlled impedance devices having an impedance variation characteristic that is related;

a reference device connected in a reference path between the input node and common node with the reference path being different from the sense path;

a closed loop control circuit connected to the second controlled impedance device for compensating for impedance variation in the sense path based on impedance variation between the sense and reference paths; and wherein the compensation for the sense path is provided to the first controlled impedance device to compensate for impedance variation in the signal path.

* * * * *